(12) United States Patent
Moffatt et al.

(10) Patent No.: US 11,586,794 B2
(45) Date of Patent: Feb. 21, 2023

(54) SEMICONDUCTOR PROCESSING TOOLS WITH IMPROVED PERFORMANCE BY USE OF HYBRID LEARNING MODELS

(71) Applicant: Applied Materials, Inc., Santa Clara, CA (US)

(72) Inventors: Stephen Moffatt, St. Brelade, CA (US); Sheldon R. Normand, Santa Clara, CA (US); Dermot P. Cantwell, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/944,012

(22) Filed: Jul. 30, 2020

(65) Prior Publication Data
US 2022/0035979 A1 Feb. 3, 2022

(51) Int. Cl.
*G06F 30/398* (2020.01)
*G06F 30/367* (2020.01)
*H01L 21/66* (2006.01)

(52) U.S. Cl.
CPC .......... *G06F 30/367* (2020.01); *G06F 30/398* (2020.01); *H01L 22/20* (2013.01)

(58) Field of Classification Search
CPC .. G03F 7/70633; G03F 7/705; G03F 7/70625; G03F 7/70616; G03F 7/70641; G03F 7/70525; G03F 7/7065; G03F 7/70508; G03F 7/70683; G03F 1/36; G03F 1/70; G03F 7/70516; G03F 1/44; G03F 9/7046; G03F 7/70133; G03F 9/7092; G03F 1/72; G03F 7/70491; G03F 7/70558; G03F 7/70783; G03F 9/7019; G03F 9/7026; G03F 1/68; G03F 1/80; G03F 7/70425;
(Continued)

(56) References Cited

U.S. PATENT DOCUMENTS

2002/0018217 A1* 2/2002 Weber-Grabau ..... G01N 21/956
356/601
2013/0024019 A1* 1/2013 Wang ............... G05B 19/41875
700/103
(Continued)

FOREIGN PATENT DOCUMENTS

WO WO 2005-034180 4/2005

OTHER PUBLICATIONS

International Search Report and Written Opinion from Application No. PCT/US2021/041658 dated Nov. 5, 2021 13 pgs.

*Primary Examiner* — Binh C Tat
(74) *Attorney, Agent, or Firm* — Schwabe, Williamson & Wyatt, P.C.

(57) ABSTRACT

Embodiments disclosed herein include a semiconductor manufacturing tool with a hybrid model and methods of using the hybrid model for processing wafers and/or developing process recipes. In an embodiment, a method for developing a semiconductor manufacturing process recipe comprises selecting one or more device outcomes, and querying a hybrid model to obtain a process recipe recommendation suitable for obtaining the device outcomes. In an embodiment, the hybrid process model comprises a statistical model and a physical model. In an embodiment, the method may further comprise executing a design of experiment (DoE) on a set of wafers to validate the process recipe recommended by the hybrid process model.

17 Claims, 8 Drawing Sheets

(58) Field of Classification Search
CPC ...... G03F 7/7085; G03F 1/84; G03F 7/70158; G03F 7/70441; G03F 7/70875; G03F 7/70033; G03F 7/70433; G03F 7/70533; G03F 1/62; G03F 7/7015; G03F 7/00; G03F 7/2039; G03F 7/70025; G03F 7/70091; G03F 7/70166; G03F 7/70608; G03F 7/70658; G03F 7/70725; G03F 7/70958; G03F 9/7003; G03F 9/7065; G03F 9/7088; G03F 1/42; G03F 1/74; G03F 7/20; G03F 7/2008; G03F 7/70191; G03F 7/70258; G03F 7/70341; G03F 7/70466; G03F 7/70483; G03F 7/70566; G03F 7/70775; G03F 7/70866; G03F 9/7023; G03F 9/7034; G03F 9/7049; G03F 7/0002; G03F 7/2002; G03F 7/2004; G03F 7/70058; G03F 7/70075; G03F 7/70083; G03F 7/70141; G03F 7/70266; G03F 7/70358; G03F 7/70458; G03F 7/7055; G03F 7/706; G03F 7/70675; G03F 7/70666; G06F 30/398; G06F 30/20; G06F 30/367; G06F 30/00; G06F 30/39; G06F 16/26; G06F 2119/18; G06F 17/10; G06F 30/392; G06F 17/18; G06F 2115/06; G06F 17/12; G06F 2111/10; G06F 2119/22; G06F 30/17; G06F 30/33; H01L 21/027; H01L 22/20; H01L 22/12; H01L 27/12; H01L 21/67276

USPC ..................................... 716/100–108, 50–56

See application file for complete search history.

(56) References Cited

U.S. PATENT DOCUMENTS

| | | | |
|---|---|---|---|
| 2016/0061589 A1* | 3/2016 | Bhattacharyya | .... G03F 7/70633 356/620 |
| 2018/0108578 A1 | 4/2018 | Pandev et al. | |
| 2018/0112968 A1* | 4/2018 | Chen | ................. G01N 23/2251 |
| 2019/0129316 A1* | 5/2019 | Zhou | ................... G03F 7/70625 |
| 2019/0384882 A1 | 12/2019 | Lin et al. | |
| 2020/0110852 A1 | 4/2020 | Banna et al. | |
| 2020/0111689 A1* | 4/2020 | Banna | ..................... H01L 22/26 |

* cited by examiner

SEMICONDUCTOR PROCESSING TOOLS WITH IMPROVED PERFORMANCE BY USE OF HYBRID LEARNING MODELS

BACKGROUND

1) Field

Embodiments of the present disclosure pertain to the field of semiconductor processing and, in particular, to using a hybrid model of a semiconductor manufacturing process that comprises a statistical model and a physical model for recipe development and chamber baselining.

2) Description of Related Art

Semiconductor wafer processing has been increasing in complexity as semiconductor devices continue to progress to smaller feature sizes. A given process may include many different processing parameters (i.e., knobs) that can be individually controlled in order to provide a desired outcome on the wafer. For example, the desired outcome on the wafer may refer to a feature profile, a thickness of a layer, a chemical composition of a layer, or the like. As the number of knobs increase, the theoretical process space available to tune and optimize the process grows exceedingly large.

In order to develop a process recipe for high volume manufacturing (HVM) process engineers rely on their experience and expertise to identify a baseline recipe that may provide a rough approximation of the desire outcome on the wafer. A design of experiment (DoE) is then generated around the baseline recipe. A DoE relies on the processing of a set of wafers (or coupons) in order to identify how the knobs interact with each other to produce an outcome on the wafer. The DoE results may be interpreted by the process engineer to further refine the baseline recipe. Additional DoEs may also be executed in order to converge on the desired outcome on the wafer. Such an iterative process is time and resource intensive.

Additionally, once the final processing recipe has been developed, chamber drift during many iterations of the process for different wafers may result in changes to the outcome on the wafer. Chamber drift may be the result of erosion of consumable portions of the chamber, degradation of components (e.g., sensors, lamps, etc.), deposition of byproduct films over surfaces, or the like. Accordingly, additional tuning is needed even after the extensive recipe development process.

SUMMARY

Embodiments disclosed herein include a semiconductor manufacturing tool with a hybrid model and methods of using the hybrid model for processing wafers and/or developing process recipes. In an embodiment, a method for developing a semiconductor manufacturing process recipe comprises selecting one or more device outcomes, and querying a hybrid model to obtain a process recipe recommendation suitable for obtaining the device outcomes. In an embodiment, the hybrid process model comprises a statistical model and a physical model. In an embodiment, the method may further comprise executing a design of experiment (DoE) on a set of wafers to validate the process recipe recommended by the hybrid process model.

In an additional embodiment, a method of baselining a chamber executing a semiconductor manufacturing process is provided. In an embodiment, the method comprises running a limited design of experiment (DoE) of wafers with external metrology to baseline chamber performance. The embodiment may further include adding wafer outcomes and metrology data from the limited DoE to a hybrid model as a calibration data set. In an embodiment, the hybrid model comprises a statistical model and a physical model. In an embodiment, the method further comprises adjusting the model's predictions to account for specific chamber conditions and/or wafer conditions identified by the limited DoE. In an embodiment, the method further comprises predicting optimized process parameters to achieve a desired wafer outcome for wafers processed in the chamber.

In an additional embodiment, a method for processing wafers in a processing tool is provided. In an embodiment, the method comprises providing a hybrid model of a processing tool. In an embodiment, the hybrid model comprises a statistical model and a physical model. In an embodiment, the method further comprises executing a recipe in the processing tool to process a first wafer, obtaining wafer data from the first wafer after execution of the recipe, and obtaining process data from the processing tool relating to the execution of the recipe. In an embodiment, the method further comprises providing the wafer data and the process data to the hybrid model to generate an updated hybrid model, and using the updated hybrid model to generate a modified recipe to account for chamber drift in the processing tool. In an embodiment, the method further comprises executing the modified recipe in the processing tool to process a second wafer.

Embodiments may also include a non-transitory computer readable medium comprising instructions, which, when executed by a processor, cause the processor to perform operations for developing a semiconductor manufacturing process recipe. In an embodiment, the operations may include selecting one or more device outcomes on a processed wafer, querying a hybrid model to obtain a process recipe recommendation suitable for obtaining the device outcomes. In an embodiment, the hybrid model comprises a statistical model and a physical model. In an embodiment, the process may further comprise executing a design of experiment (DoE) on a set of wafers to validate the process recipe recommended by the hybrid process model. In an embodiment, executing the DoE comprises measuring the DoE wafer results with a metrology tool, and determining from the DoE wafer results if the desired device outcomes are achieved.

DETAILED DESCRIPTION

Figure 1A:
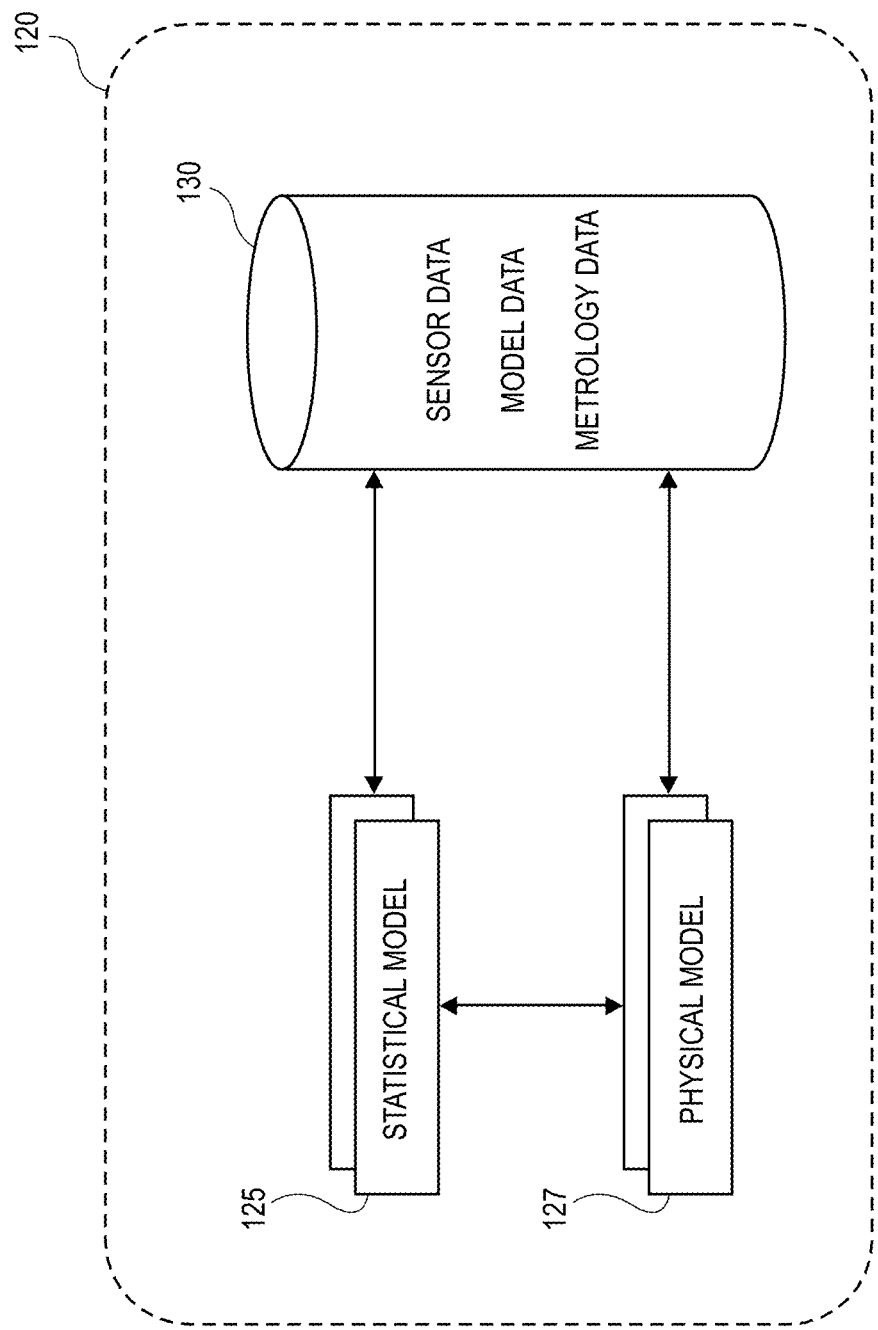
FIG. 1A is schematic of a hybrid model that comprises a statistical model and a physical model, in accordance with an embodiment.

Methods using a hybrid model of a semiconductor manufacturing process that comprises a statistical model and a physical model for recipe development and chamber baselining are described herein. In the following description, numerous specific details are set forth, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

As noted above recipe development and chamber baselining are time and resource intensive. Particularly, the process space available to tune and optimize a given process is extremely large, and it is practically impossible to explore the entire process space empirically within any reasonable timeframe. Furthermore, due to the interaction between processing parameters and their impact on the process performance, it is extremely hard to predict the combined effect of simultaneous variation of multiple processing parameters by manually scanning one processing parameter at a time.

Accordingly, embodiments disclosed herein leverage the use of a hybrid model to query an entire process space without the need to process physical wafers in a large design of experiment (DoE). Therefore, time and resources dedicated to recipe development can be significantly reduced. Additionally, the hybrid model may be updated during processing of wafers in a chamber. The updated hybrid model can provide accurate tracking of chamber drift and allows for revisions to the process recipe to be made without extensive DoE of physical wafers or reliance on only the experience and knowledge of a process engineer. As such, the use of a hybrid model in accordance with embodiments disclosed herein provides at least the following benefits: 1) reduced unscheduled downtime of the tool; 2) reduced reliance on calibration or monitoring wafers; 3) tighter process control and better uniformities, repeatabilities, and yield; 4) lower scrap; 5) improved chamber matching; 6) enables automatic tool health monitoring; and 7) provides improved recovery from planned maintenance (PM).

As used herein, a "process space" may refer to a multi-dimensional process space that maps processing parameters to one or more device outcomes on the wafer. The processing parameters, sometime called knobs, are variables that can be controlled to control a process. For example, knobs may include pressure, processing gas flow rates, temperature, RF source power, bias power, and the like. The device outcomes may refer to measurable properties of features on a wafer after processing. For example, device outcomes may include a feature profile, a layer thickness, a thickness uniformity, a material composition of a layer, a composition uniformity, a porosity, a film stress, or the like. In an embodiment, device outcomes may also refer to process uniformity across chambers in a facility (e.g., chamber matching), wafer to wafer uniformity, uniformity between different wafer lots, and the like. That is, device outcomes are not limited to an outcome on a single wafer. Each point in the process space may be a representation of a set of processing parameter values and the resulting device outcome (or outcomes) produced by the set of processing parameters.

In an embodiment, the hybrid model may comprise a statistical model and a physical model. The statistical model may be built using a DoE of actual wafers to populate a portion of the process space. Algorithms may then be used to extrapolate the remainder of the process space. The physical model is based on real world physical and chemical interactions that occur within the processing chamber. A simulation of the physical and chemical interactions in the processing chamber over a range of different processing parameters may be used to generate the physical model. In an embodiment, the physical model is merged with the statistical model to provide the hybrid model. For example, the physical model may be used to fill any gaps in the statistical model and/or to verify extrapolated data points.

In an embodiment, the hybrid model may be used for process recipe development and/or for chamber baselining to account for chamber drift. In the case of process recipe development, the hybrid model is queried in order to select a baseline recipe instead of relying solely on the skill and knowledge of a process engineer. The baseline recipe provided by the hybrid model will produce a device outcome that closely approximates the desired device outcome. As such, a small DoE to verify the baseline recipe may be all that is needed to validate the process recipe predicted by the hybrid model.

In the case of chamber baselining, the hybrid model may be updated with a calibration data set obtained from processed wafers. The calibration data set may comprise metrology data and/or other device outcomes collected during or after the processing of wafers. The updated hybrid model may then be queried in order to select a modified process recipe that accounts for the chamber drift in order to produce the desired device outcomes on subsequently processed wafers. Chamber baselining is therefore, a powerful tool to provide chamber mapping. That is, the chamber baselining process (e.g., updating the hybrid model using a calibration data set) allows for the current chamber conditions to be accurately accounted for in the processing of wafers. Additionally, baselining may also be useful for accounting for differences between wafers. For example, the wafers between lots (or even within a single lot) may have differences (e.g., due to previous processing non-uniformities). By updating the hybrid model with a baselining process, the variation between wafers may be accounted for in order to provide a desired device outcome.

Hybrid models disclosed herein may be used in any semiconductor manufacturing process. For example, a hybrid model may be used in order to provide recipe development and/or chamber baselining for etching processes, deposition processes, cleaning processes, planarization processes, or the like. The processes investigated with a hybrid model may include plasma processes, thermal processes, wet chemistry processes, or any other process. In an embodiment, the processing tool that is modeled with the hybrid model may include a plasma chamber, a vacuum chamber, a thermal chamber, or the like.

In a particular embodiment, a hybrid model is used to investigate an oxidation process, such as a radical oxidation process. In a radical oxidation process processing parameters may include, but are not limited to, pressure, flow rates of processing gasses, temperature, and soak time. The device outcomes being controlled in a radical oxidation process may include, but are not limited to, oxide thickness, thickness uniformity across the wafer, material composition of the oxide, material composition uniformity, and a profile of the oxide layer.

Referring now to FIG. 1A, a schematic of the hybrid model server 120 is shown, in accordance with an embodiment. In an embodiment, the hybrid model server 120 may comprise a statistical model 125 and a physical model 127. The statistical model 125 and the physical model 127 may be communicatively coupled to a database 130 for storing input data (e.g., sensor data, model data, metrology data, etc.) used to build and/or update the statistical model 125 and the physical model 127.

In an embodiment, the statistical model 125 may be generated from a physical DoE and use interpolation to provide an expanded process space model. The physical wafers that are processed may be used to provide a mapping of processing parameters to specific device outcomes. The physical DoE may also be used to identify interactions between different processing parameters. After the data (e.g., metrology data, sensor data, process parameter data, etc.) for the physical wafers is provided, interpolation is used to fill gaps in the process space. In an embodiment, data, such as metrology data, may be obtained using an external tool that is communicatively coupled to the hybrid model server 120 by a data link (e.g., a wired or wireless data link). The interpolation may be done using any suitable algorithm or algorithms. Algorithms may include, but are not limited to a neural network, deep learning or any other known techniques used for regression analysis (e.g., linear, partial least squares, Gaussian, polynomials, convolution neural networks for regression, regression trees and others).

In an embodiment, the statistical model 125 may be provided as a module that is sold or licensed for use in conjunction with the processing tool. That is, a physical DoE for the statistical model 125 may be executed by the manufacturer of the processing tool. In other embodiments, the statistical model 125 may be generated by executing the physical DoE on-site. In yet another embodiment, a generic statistical model 125 may be provided by the tool manufacturer and a subsequent physical DoE may be executed on-site to provide a calibration of the statistical model 125 to more closely model the particular processing tool being investigated.

In an embodiment, the physical model 127 may be generated using real world physics and chemistry relationships. For example, physics and chemistry equations for various interactions within a processing chamber may be used to build the physical model. The physical model 127 may also utilize chamber geometries or other chamber configurations to improve the accuracy of the physical model 127. The physical model 127 may be the result of a simulation of the physical and chemical interactions within a processing tool across a plurality of different processing parameters. The physical model 127 may be a module that is sold or licensed for use in conjunction with the processing tool.

In an embodiment, the physical model 127 and the statistical model 125 may be able to reference each other (as indicated by the arrow). Cross-referencing between the two models 127 and 125 allows for validation of each of the models and for filling in any gaps in the individual models. In an embodiment, the physical model 127 and the statistical model 125 may be combined to provide a more robust hybrid model.

Figure 1B:
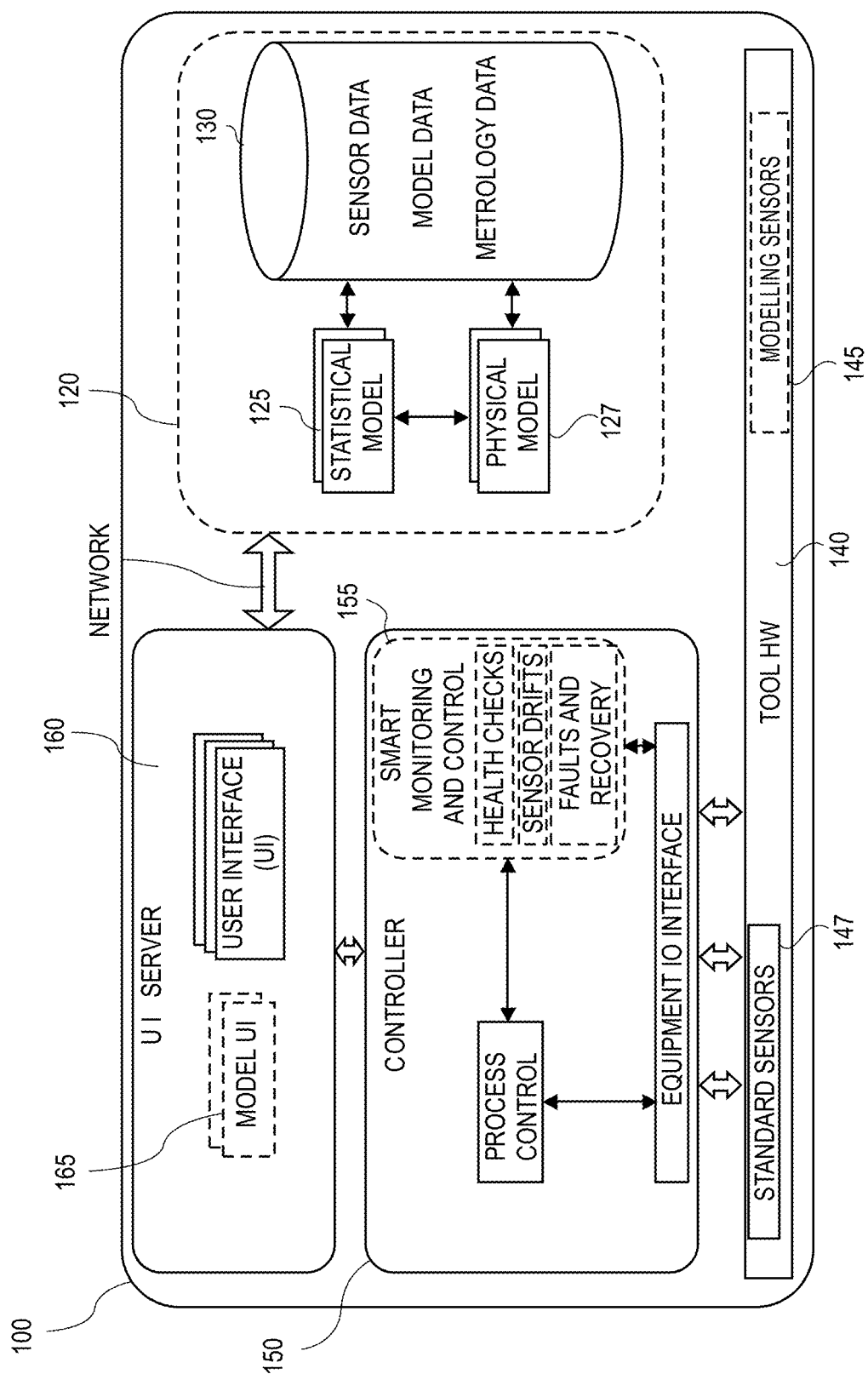
FIG. 1B is a schematic of a processing tool that comprises a hybrid model, in accordance with an embodiment.

Referring now to FIG. 1B, a schematic of a processing tool 100 is shown, in accordance with an embodiment. As shown, the hybrid model server 120 may be integrated with the processing tool 100. For example, the hybrid model server 120 may be communicatively coupled to a front end server 160 by a network connection, as indicated by the arrow. However, in other embodiments, the hybrid model server 120 may be external to the processing tool 100. For example, hybrid model server 120 may be communicatively coupled to the processing tool 100 through an external network or the like.

In an embodiment, the processing tool 100 may comprise a front end server 160, a tool control server 150, and tool hardware 140. The front end server 160 may comprise a user interface 165 for the hybrid model server 120. The user interface 165 provides an interface for a process engineer to utilize the hybrid modeling in order to execute various operations, such as recipe development or chamber baselining, as will be described in greater detail below.

The tool control server 150 may comprise a smart monitoring and control block 155. The smart monitoring and control block 155 may comprise modules for providing diagnostics and other monitoring of the processing tool 100. Modules may include, but are not limited to health checks, sensor drift, fault recovery, and leak detection. The smart monitoring and control block 155 may receive data from various sensors implemented in the tool hardware as inputs. The sensors may include standard sensors 147 that are generally present in semiconductor manufacturing tools 100 to allow for operation of the tool 100. The sensors may also include modelling sensors 145 that are added into the tool 100. The modelling sensors 145 provide additional information that is necessary for the building of highly detailed hybrid models. For example, the modelling sensors may include virtual sensors and/or witness sensors. Virtual sensors may utilize the data obtained from two or more physical sensors and implement interpolation and/or extrapolation in order to provide additional sensor data not obtainable from physical sensors alone. In a particular example, a virtual sensor may utilize an upstream pressure sensor and a downstream pressure sensor in order to calculate a flow rate through a portion of the processing tool, such as a gas cartridge. Generally, modelling sensors may include any type of sensor, such as, but not limited to, pressure sensors, temperature sensors, and gas concentration sensors. In an embodiment, the smart monitoring and control block 155 may provide data that is used by the hybrid model server 120. In other embodiments, output data from the various modelling sensors 145 may be provided directly to the hybrid model server 120.

Figure 2A:
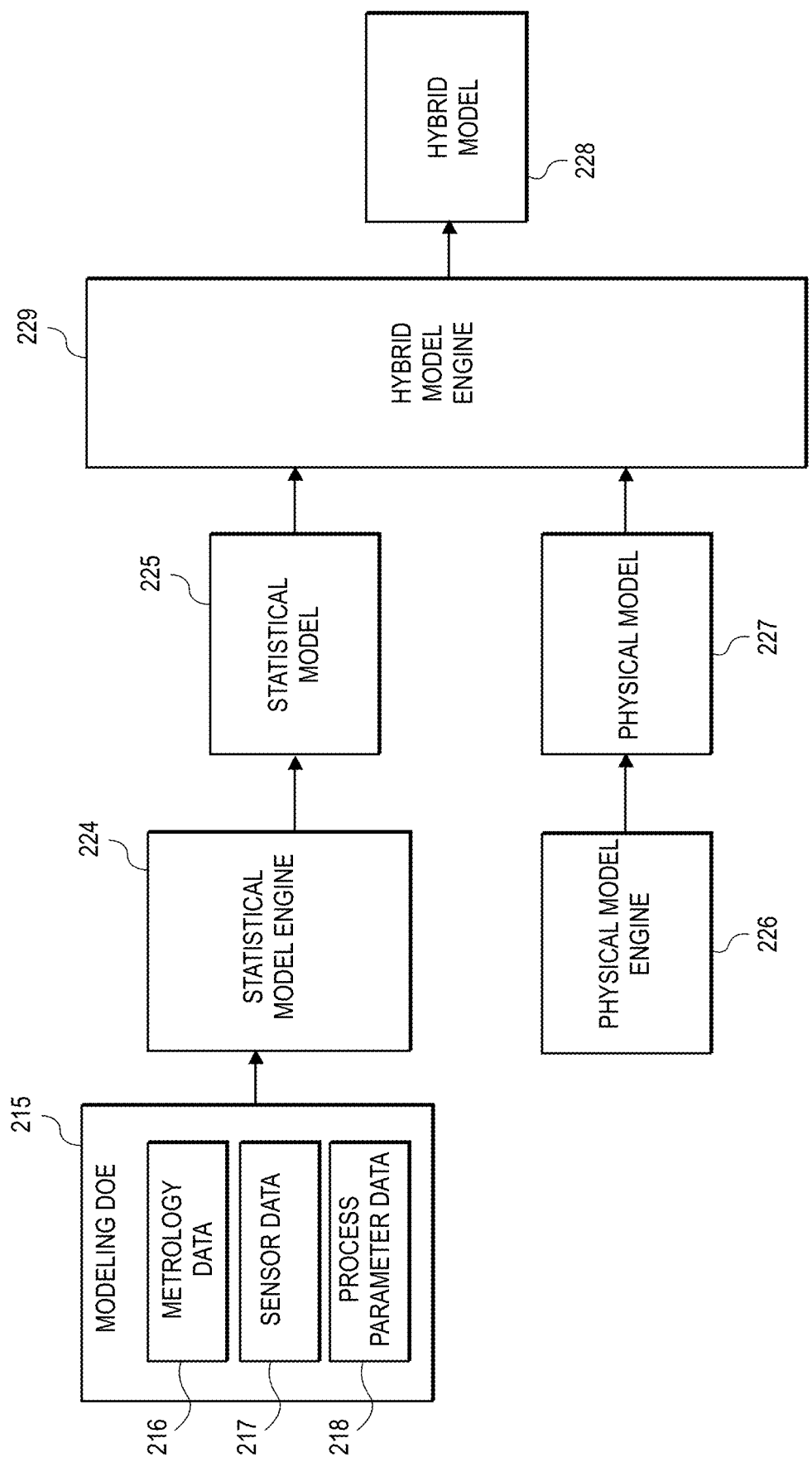
FIG. 2A is a flow diagram illustrating a process for developing a hybrid model where the statistical model and the physical model are inputs to a hybrid model engine, in accordance with an embodiment.

Referring now to FIG. 2A, a flow diagram illustrating a process for generating a hybrid model is shown, in accordance with an embodiment. In an embodiment, input from a modeling DoE 215 is inputted into a statistical model engine 224. The modeling DoE 215 may include the processing of a number of physical wafers. The DoE 215 may include various data sources that are fed to the statistical model engine 224. For example, metrology data 216 obtained during or after processing the wafers may be provided to the statistical model engine 224. Additionally, sensor data 217 from sensors in the processing tool may be provided to the statistical model engine 224. Process parameter data 218

(i.e., the values of various process parameters during the processing of the wafers) may also be provided to the statistical model engine 224.

In an embodiment, the statistical model engine 224 may be implemented as hardware and/or software suitable for analyzing the various data sources and outputting a statistical model 225. The statistical model engine 224 may utilize machine learning based on neural networks, or any other known techniques used for regression analysis (e.g., linear, partial least squares, Gaussian, polynomials, convolution neural networks for regression, regression tress, and others) in order to interpolate a larger process space than is available from the physical DoE data alone.

In an embodiment, a physical model engine 226 is used to generate the physical model 227. In an embodiment, the physical model engine 226 may be implemented as hardware and/or software. The physical model engine 226 takes as inputs the chamber configuration and real world physics and chemical equations. The physical model engine 226 may implement a simulation of the physical and chemical interactions within a processing tool across a plurality of different processing parameters in order to build the physical model 227. As such, changes to processing parameters that modify the physical and/or chemical reactions in the processing tool may be mapped to expected device outcomes.

In an embodiment, the statistical model 225 and the physical model 227 are used as inputs for the generation of a hybrid model 228. For example, the statistical model 225 and the physical model 227 may be inputs for a hybrid model engine 229. The hybrid model engine 229 processes the physical model 227 and the statistical model 225 and outputs the hybrid model 228. In some embodiments, the physical model 227 may be used to derive some physical measurements that cannot be measured, and the physical model 227 outputs may be considered as additional inputs to the statistical model. In such situations, the hybrid model engine 229 adds the information from the physical model 227 to the statistical model 225 to provide the hybrid model 228. The hybrid model 228, therefore, allows for the two models 225 and 227 to be used for validation of individual points in the process space, and provides a more complete process space that can be individually tailored to a given processing tool. However, in some embodiments, the physical model 227 and the statistical model 225 may be stand-alone models, depending on the outputs. That is, in some embodiments, the statistical model 225 and the physical model 227 may not be merged into a hybrid model.

Figure 2B:
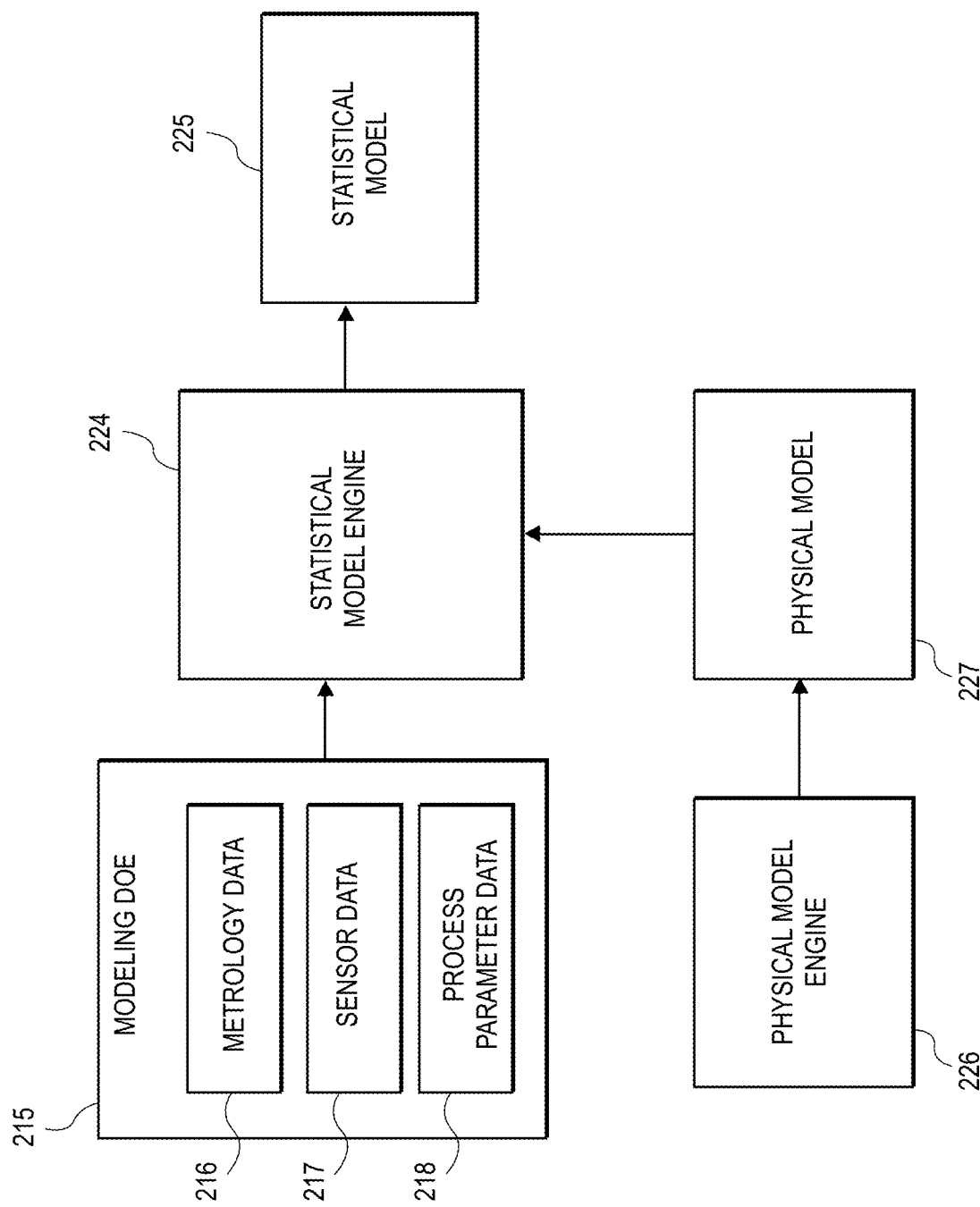
FIG. 2B is a flow diagram illustrating a process for developing a hybrid model where the physical model is an input to the statistical model engine, in accordance with an embodiment.

In an embodiment, the hybrid model may also be considered as another instance of a statistical model 225. For example, in FIG. 2B, the physical model 227 outputted by the physical model engine 226 may be used as an input for the statistical model engine 224. The statistical model engine 224 therefore has additional inputs in order to generate a statistical model 225 that includes information from the physical model 227. Particularly, the statistical model 224 may already include the data from the physical model 227, and the use of a hybrid model engine to produce a hybrid model may not be necessary in all embodiments.

Figure 3:
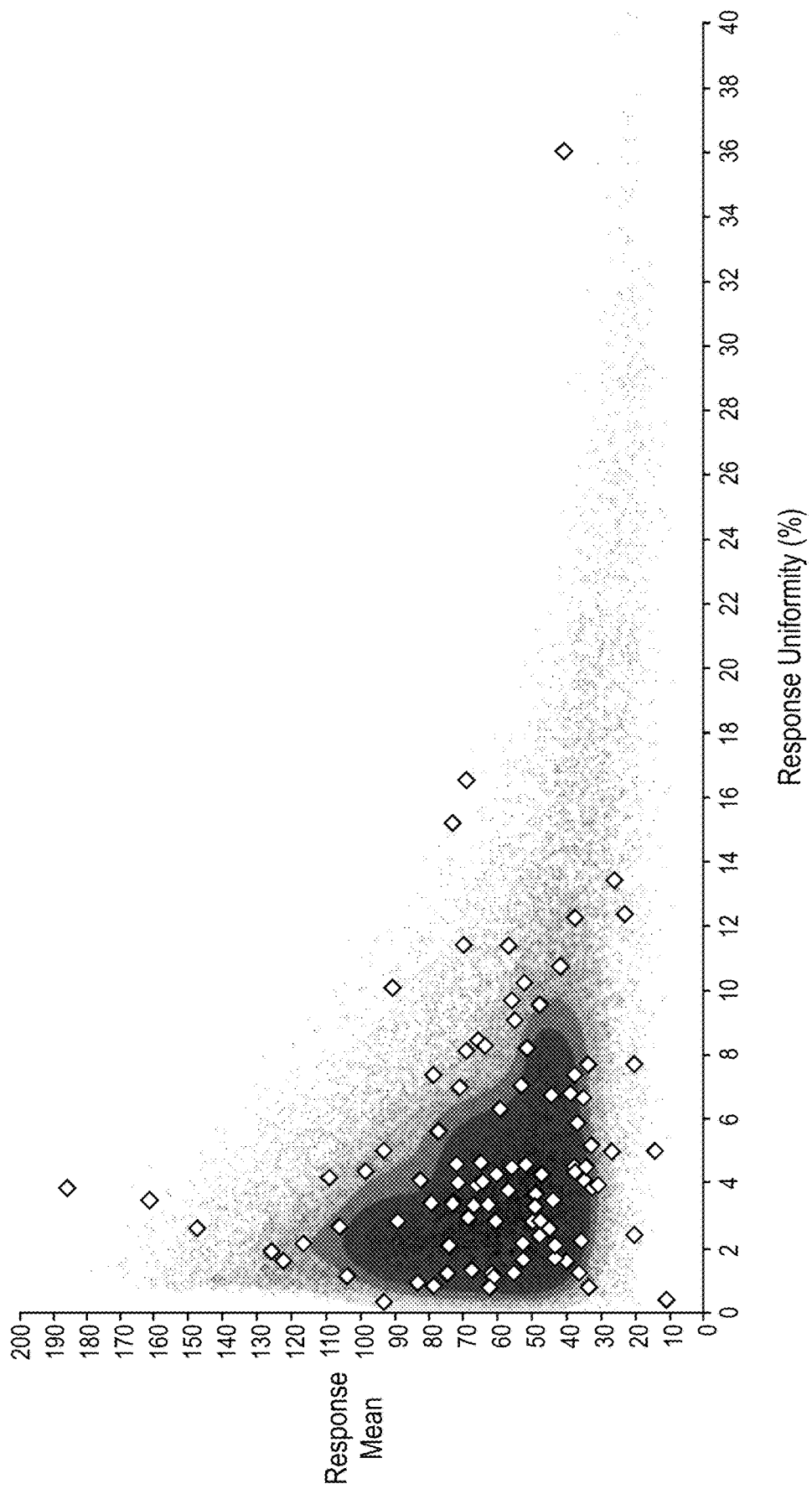
FIG. 3 is a chart illustrating a two-dimensional representation of a multi-dimensional process space provided by a hybrid model, in accordance with an embodiment.

Referring now to FIG. 3, a chart illustrating a representation of the process space provided by a hybrid model is shown, in accordance with an embodiment. Each point on the chart represents a set of processing parameters and the resulting outcome on the wafer. For example, the X-axis may be a response uniformity and the Y-axis may be a response mean. The chart depicts that for a given set of processing parameters, the resulting outcome on the wafer will have a particular response uniformity and response mean.

In the illustrated chart, the larger diamond points are data points obtained from the modeling DoE. That is, the larger points are based on a data set obtained from the physical processing of wafers. The smaller points represent virtual points that are generated using the hybrid model. As shown, the hybrid model provides data for a process space that is much more detailed than what is available from the processed wafers alone.

Figure 4:
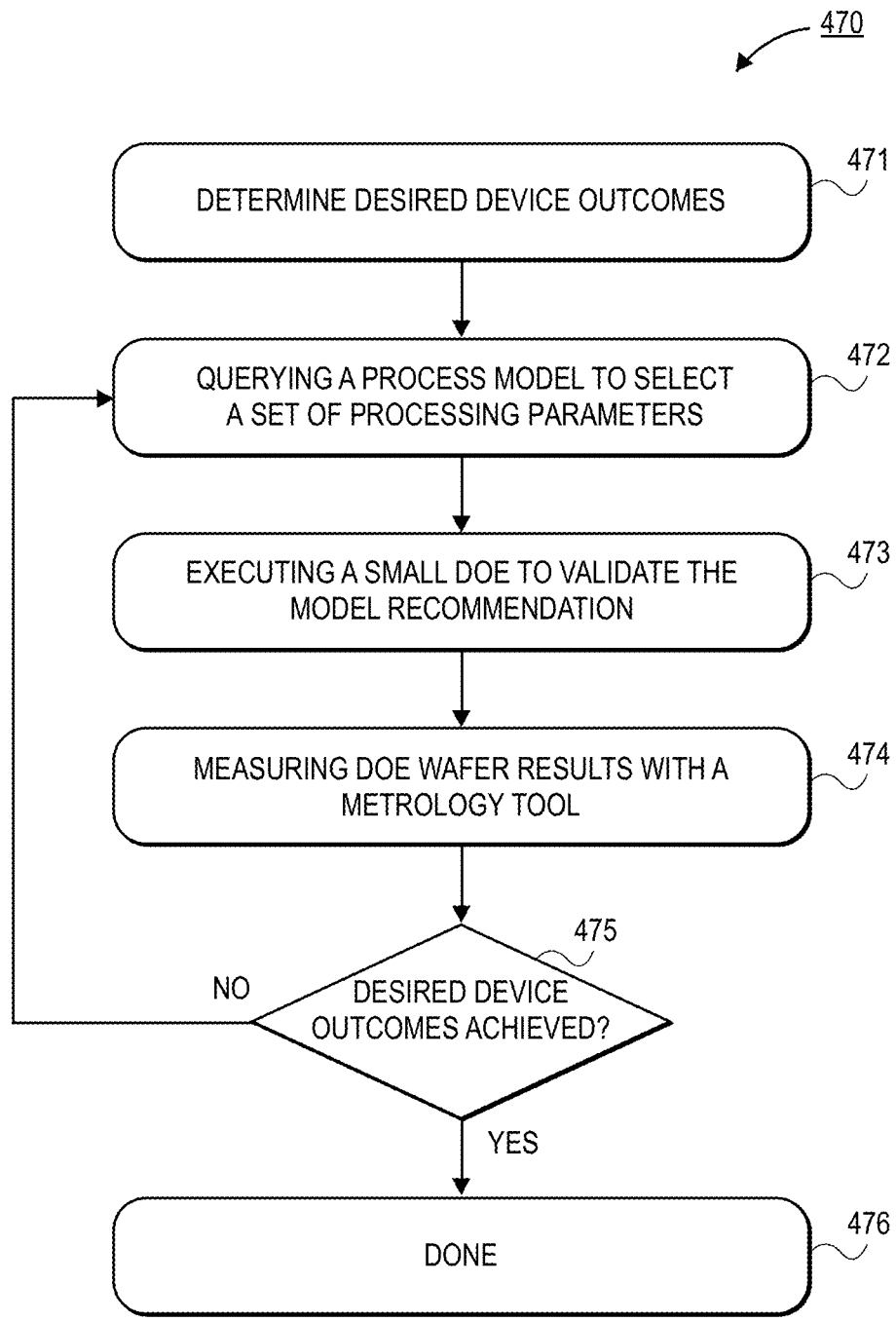
FIG. 4 is a flow diagram illustrating a process for developing a process recipe using a hybrid model, in accordance with an embodiment.

Referring now to FIG. 4 a flow diagram illustrating a process 470 for developing a process recipe using a hybrid model is shown, in accordance with an embodiment. The targeted process recipe is a process recipe having a set of process parameters that will result in desired device outcomes on the wafer. In an embodiment, the process 470 may begin with operation 471, which includes determining desired device outcomes. In an embodiment, the device outcomes may be on wafer device dimensions, material compositions, or the like. For example, the device outcomes may include a layer thickness, a thickness uniformity across the wafer, a material composition of a layer, or a material composition uniformity.

In an embodiment, process 470 may continue with operation 472, which comprises querying a hybrid model to select a set of processing parameters. In an embodiment, the hybrid model may be a model of a process space generated from the combination of a statistical model and a physical model. The statistical model may be generated using a DoE of actual wafers as described above. The physical model may be based on real world physics and chemical equations. For example, the physical model may be generated from a simulation of physical and chemical interactions within the processing tool across a plurality of different processing parameters. In an embodiment, the hybrid model may cover an entire process space available to the processing tool.

The hybrid model allows for a stable process recipe to be identified without relying solely on the experience and knowledge of a process engineer. Instead, a baseline recipe that is expected to produce device outcomes that closely match the targeted device outcomes is able to be selected from the process space of the hybrid model.

In an embodiment, process 470 may continue with operation 473, which comprises executing a small DoE to validate the model recommendation. Due to the high precision of the hybrid model, a small DoE (e.g., 20 or fewer wafers) may be all that is needed to validate the model recommendation. In an embodiment, the DoE may be designed by a process engineer.

In an embodiment, process 470 may continue with operation 474, which comprises measuring the DoE wafer results with one or more metrology tools. The metrology data can be used to verify that the targeted device outcomes have been achieved on the wafer.

In an embodiment, process 470 may continue with operation 475, which comprises determining if the desired device outcomes have been achieved. If the desired device outcomes have been achieved, then the process proceeds along to operation 476 and the process is completed. If the desired device outcomes have not been achieved, then the process may cycle back to operation 472. In an embodiment, the data from the small DoE may be fed back into the hybrid model in order to update the hybrid model. The updated hybrid model may then be queried to provide a second baseline recipe. In this manner, even when the first iteration is not successful, the process may still converge to the proper recipe quickly, without the need for extensive DoE and wasted resources.

Figure 5:
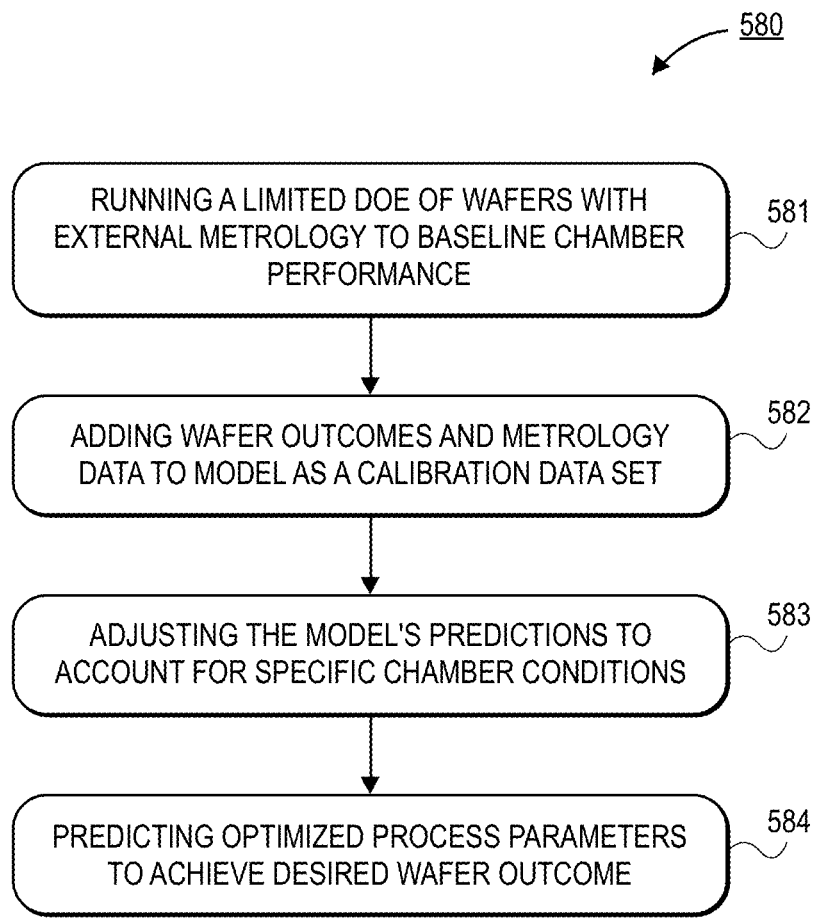
FIG. 5 is a flow diagram illustrating a process for baselining a chamber using a hybrid model, in accordance with an embodiment.

Referring now to FIG. 5, a flow diagram illustrating a process 580 for baselining a processing tool is shown, in accordance with an embodiment. In an embodiment, the baselining process may be beneficial to account for chamber drift during the processing of wafers in the processing tool. In an embodiment, the baselining process may be implemented at any desired frequency. For example, the process 580 may be implemented per lot, per planned maintenance (PM) event, or when the processed wafers have device outcomes that are outside of specified ranges.

In an embodiment, the process 580 may begin with operation 581, which comprises running a limited DoE of wafers with external metrology to baseline chamber performance. In an embodiment, the limited DoE may include twenty wafers or fewer. The limited DoE may utilize the process recipe of record as a baseline. The external metrology may include any metrology suitable to determine device outcomes for the processed wafers. For example, in the case of an oxidation process, ellipsometry may be used to investigate film thickness and thickness uniformity across a wafer.

In an embodiment, the process 580 may continue with operation 582, which comprises adding the device outcomes and other metrology data to the hybrid model. The additional data added to the hybrid model may be referred to as a calibration data set. The calibration data set is used to update the hybrid model so that the hybrid model more accurately reflects the current condition of the processing tool. For example, the process 580 may include operation 583, which comprises adjusting the model's predictions to account for specific chamber conditions. That is, the process space of the hybrid model is updated to more closely match the conditions of the processing tool being investigated.

In an embodiment, the hybrid model may be a model of a process space generated from the combination of a statistical model and a physical model. The statistical model may be generated using a DoE of actual wafers as described above. The physical model may be based on real world physics and chemical equations. For example, the physical model may be generated from a simulation of physical and chemical interactions within a processing tool across a plurality of different processing parameters. In an embodiment, the hybrid model may cover an entire process space available to the processing tool.

In an embodiment, process 580 may continue with operation 584, which comprises predicting optimized process parameters to achieve a desired wafer outcome of wafers subsequently processed in the chamber. The optimized process parameters may be selected after the hybrid model has been updated to include the calibration data set. Accordingly, the new process recipe provides wafer parameters that result in wafer outcomes that are more closely matched to the targeted values, despite changes to the chamber condition. As such, chamber drift may be monitored and accounted for in order to maintain a tight process window and increase uniformity, repeatability, and yield. Additionally, unscheduled downtime of the tool is reduced since the processing recipe can be accurately adjusted to account for chamber drift. Furthermore, when PM does occur, process 580 may be implemented to provide a shorter recovery time, which improves tool utilization.

In an embodiment, a hybrid model may further be used to provide continuous (or near continuous) revision of a processing recipe to account for chamber drift. For example, wafer and process data obtained during the processing of device wafers may be obtained and used to update the hybrid model. That is, a dedicated DoE may not be necessary to provide a calibration data set. Wafer data from device wafers may be obtained for every wafer or for a subset of the wafers being processed.

Such an embodiment, may include a providing a hybrid model of a processing tool. The hybrid model may include a statistical model and a physical model that is similar to the hybrid models described above. In an embodiment, the process may begin with a recipe being executed in the processing tool to process a first wafer. After processing the first wafer, wafer data from the first wafer and process data from the processing tool relating to the execution of the recipe may be obtained. In an embodiment, the wafer data may comprise metrology data, such as, but not limited to, a thickness, a thickness uniformity, a profile, and a hydrogen percentage. In an embodiment, process data may include data obtained from sensors within processing tool and/or tool configuration information. In an embodiment, the wafer data and the process data is provided to the hybrid model to generate an updated hybrid model. In an embodiment, the updated hybrid model is used to generate a modified recipe to account for chamber drift in the processing tool. Embodiments may then include executing the modified recipe in the processing tool to process a second wafer. While processing of a single first wafer is described above, it is to be appreciated that a plurality of first wafers may be processed before the updated hybrid model is generated. In such an embodiment, multiple sets of wafer data and process data may be used to generate the updated hybrid model.

Figure 6:
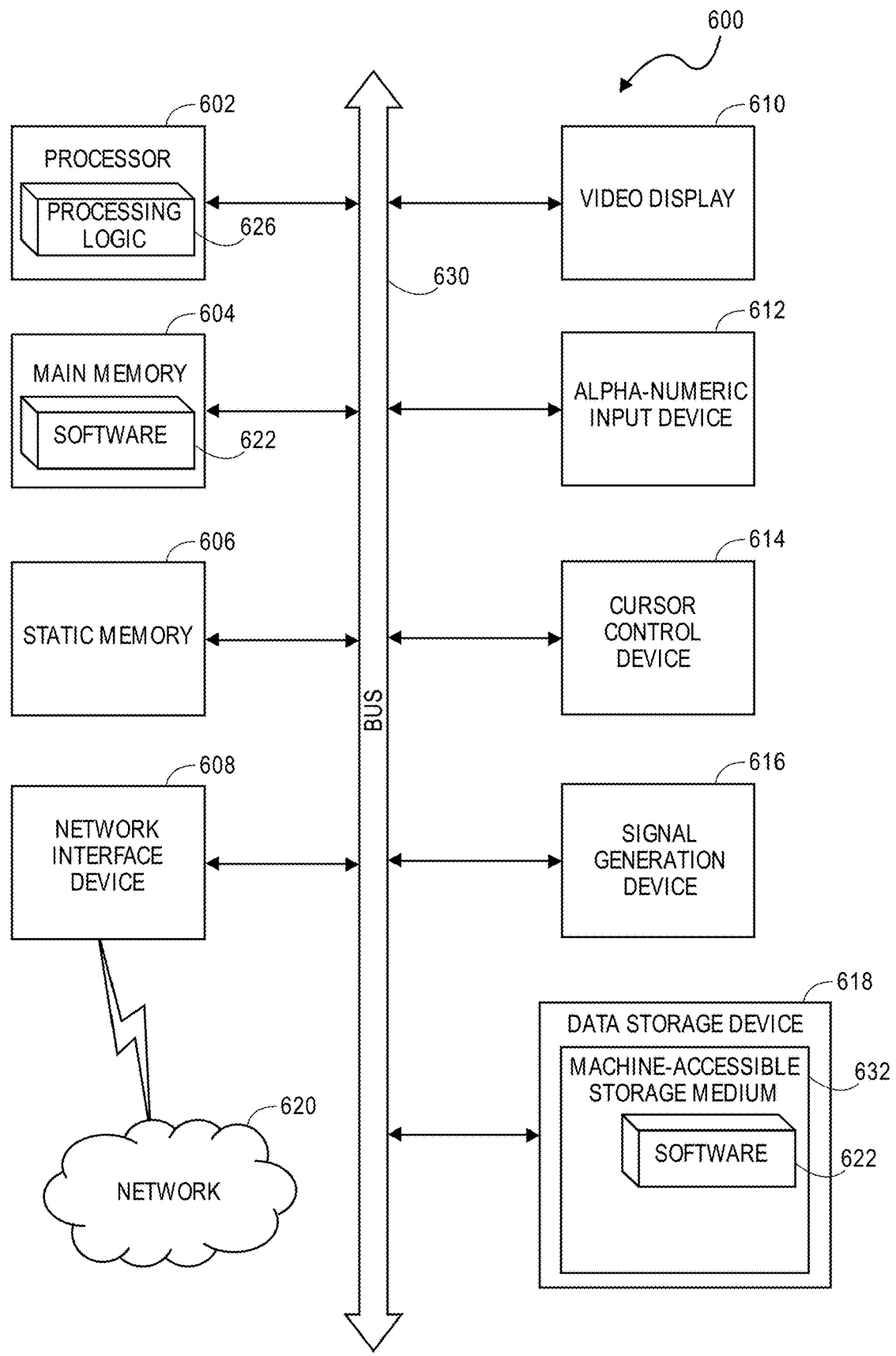
FIG. 6 illustrates a block diagram of an exemplary computer system, in accordance with an embodiment of the present disclosure.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), MRAM, etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of processing a wafer using insight from a hybrid model and/or a method of updating or building a hybrid model.

Thus, methods for using a hybrid model for processing wafers in a processing tool have been disclosed.

What is claimed is:

1. A method for developing a semiconductor manufacturing process recipe, comprising:
   selecting one or more device outcomes;
   querying a hybrid model to obtain a process recipe recommendation suitable for obtaining the device outcomes, wherein the hybrid process model comprises:
      a statistical model; and
      a physical model, wherein the physical model is generated from a simulation of physical and chemical interactions within a processing tool across a plurality of different processing parameters;
   executing a design of experiment (DoE) on a set of wafers to validate the process recipe recommended by the hybrid process model and to provide a validated process recipe, wherein the validated process recipe comprises an oxidation process, the oxidation process for growth of an oxide material;
   applying the validated process recipe to a wafer, wherein applying the validated process recipe to the wafer comprises applying the oxidation process to grow the oxide material the wafer executing the recipe on a plurality of first wafers;
   obtaining wafer data from the plurality of first wafers;
   obtaining process data from the processing tool relating to the execution of the recipe on the plurality of first wafers;
   and providing the wafer data and the process data from the processing of the plurality of first wafers to the hybrid model to generate an updated hybrid model.

2. The method of claim 1, wherein executing the DoE comprises:
   measuring the DoE wafer results with a metrology tool; and
   determining from the DoE wafer results if the desired device outcomes are achieved.

3. The method of claim 1, wherein the oxidation process is a radical oxidation process.

4. The method of claim 3, wherein the process recipe comprises one or more of a pressure, a temperature, a flow rate, and a soak time.

5. The method of claim 3, wherein the device outcomes comprise one or more of a thickness, a thickness uniformity, a profile, and a hydrogen percentage.

6. The method of claim 1, wherein the statistical model is generated from a physical DoE and interpolation of data from the physical DoE.

7. The method of claim 1, wherein the hybrid model is a multi-dimensional process space.

8. A method of baselining a chamber executing a semiconductor manufacturing process, comprising:
   running a limited design of experiment (DoE) of wafers with external metrology to baseline chamber performance;
   adding wafer outcomes and metrology data from the limited DoE to a hybrid model as a calibration data set, wherein the hybrid model comprises:
      a statistical model; and
      a physical model, wherein the physical model is generated from a simulation of physical and chemical interactions within a processing tool across a plurality of different processing parameters;
   adjusting the model's predictions to account for specific chamber conditions and/or wafer conditions identified by the limited DoE;
   predicting optimized process parameters to achieve a desired wafer outcome for wafers processed in the chamber and to provide optimized process parameters, wherein the optimized process parameters comprise an oxidation process, the oxidation process for growth of an oxide material;
   applying the optimized process parameters to a wafer, wherein applying the optimized process parameters to the wafer comprises applying the oxidation process to grow the oxide material the wafer executing the recipe on a plurality of first wafers;
   obtaining wafer data from the plurality of first wafers;
   obtaining process data from the processing tool relating to the execution of the recipe on the plurality of first wafers;
   and providing the wafer data and the process data from the processing of the plurality of first wafers to the hybrid model to generate an updated hybrid model.

9. The method of claim 8, wherein the oxidation process is a radical oxidation process.

10. The method of claim 9, wherein the process parameters comprises one or more of a pressure, a flow rate, temperature and a soak time.

11. The method of claim 3, wherein the wafer outcome comprises one or more of a thickness, a thickness uniformity, a profile, and a hydrogen percentage.

12. The method of claim 8, wherein the statistical model is generated from a modeling DoE and interpolation of data from the modeling DoE.

13. The method of claim 8, wherein the hybrid model is a multi-dimensional process space.

14. The method of claim 8, wherein the limited DoE comprises 20 or fewer wafers.

15. A method for processing wafers in a processing tool, comprising:
   providing a hybrid model of a processing tool, wherein the hybrid model comprises:
      a statistical model; and
      a physical model, wherein the physical model is generated from a simulation of physical and chemical interactions within a processing tool across a plurality of different processing parameters;
   executing a recipe in the processing tool to process a first wafer;
   obtaining wafer data from the first wafer after execution of the recipe;
   obtaining process data from the processing tool relating to the execution of the recipe;
   providing the wafer data and the process data to the hybrid model to generate an updated hybrid model;
   using the updated hybrid model to generate a modified recipe to account for chamber drift in the processing tool, wherein the modified recipe comprises an oxidation process, the oxidation process for growth of an oxide material;
   applying the modified recipe to a second wafer in the processing tool, wherein applying the modified recipe to the wafer comprises applying the oxidation process to grow the oxide material the wafer executing the recipe on a plurality of first wafers;
   obtaining wafer data from the plurality of first wafers;
   obtaining process data from the processing tool relating to the execution of the recipe on the plurality of first wafers;
   and providing the wafer data and the process data from the processing of the plurality of first wafers to the hybrid model to generate an updated hybrid model.

16. The method of claim 15, wherein the wafer data comprises metrology data.

17. The method of claim 16, wherein the metrology data comprises one or more of a thickness, a thickness uniformity, a profile, and a hydrogen percentage.

* * * * *

UNITED STATES PATENT AND TRADEMARK OFFICE
CERTIFICATE OF CORRECTION

PATENT NO. : 11,586,794 B2  
APPLICATION NO. : 16/944012  
DATED : February 21, 2023  
INVENTOR(S) : Moffatt et al.

Page 1 of 1

It is certified that error appears in the above-identified patent and that said Letters Patent is hereby corrected as shown below:

On the Title Page

In the (72) Inventors section:
Delete "Stephen Moffatt, St. Brelade, CA" and insert -- Stephen Moffatt, St. Brelade, JE --

Signed and Sealed this  
Fourth Day of April, 2023

Katherine Kelly Vidal  
*Director of the United States Patent and Trademark Office*